(12) United States Patent
Madan

(10) Patent No.: US 6,593,630 B1
(45) Date of Patent: Jul. 15, 2003

(54) MEMORY CELL WITH REDUCED COUPLING BETWEEN PASS TRANSISTOR AND DRIVE TRANSISTOR BODIES AND METHOD

(75) Inventor: Sudhir K. Madan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/183,086

(22) Filed: Jun. 26, 2002

Related U.S. Application Data
(60) Provisional application No. 60/353,436, filed on Jan. 31, 2002.

(51) Int. Cl.[7] ............................................. H01L 29/762
(52) U.S. Cl. ....................................... 257/365; 257/379
(58) Field of Search ................................. 257/365, 368, 257/379

(56) References Cited

U.S. PATENT DOCUMENTS 4,950,620 A * 8/1990 Harrington, III ............ 438/210
6,140,684 A * 10/2000 Chan et al. .................. 257/368
6,469,356 B2 * 10/2002 Kumagai et al. ............ 257/369
6,479,905 B1 * 11/2002 Song ........................... 257/904

* cited by examiner

*Primary Examiner*—Allan R. Wilson
(74) *Attorney, Agent, or Firm*—Peter K. McLarty; W. James Brady III; Frederick J. Telecky, Jr.

(57) ABSTRACT

According to one embodiment of the present invention, a semiconductor structure includes an SOI memory cell having a pass transistor having a body and a driver transistor having a body. The SOI memory cell also includes a source voltage contact coupling the bodies of the pass transistor and the driver transistor and a non-square conductive active region coupled to the source voltage contact. The shortest distance between the body of the pass transistor and the source voltage contact is greater than the shortest distance between the body of the pass transistor and the body of the driver transistor, and the shortest distance between the body of the pass transistor and the non-square conductive active region is less than the shortest distance between the bodies of the pass transistor and the driver transistor.

23 Claims, 3 Drawing Sheets

MEMORY CELL WITH REDUCED COUPLING BETWEEN PASS TRANSISTOR AND DRIVE TRANSISTOR BODIES AND METHOD

CROSS-REFERENCE TO RELATED APPLICATIONS

This Application claims the benefit under 35 U.S.C. §119(e) of U.S. Application Ser. No. 60/353,436 filed Jan. 31, 2002, entitled Memory Cell With Reduced Coupling Between Pass Transistor And Drive Transistor Bodies And Method.

TECHNICAL FIELD OF THE INVENTION

This invention relates generally to the field of semiconductor devices and more particularly to an SRAM memory cell with reduced coupling between the bodies of pass transistor and drive transistor and method.

BACKGROUND OF THE INVENTION

Modern electronic equipment such as televisions, telephones, radios and computers are generally constructed of solid state devices. Integrated circuits are preferred in electronic equipment because they are extremely small and relatively inexpensive. Additionally, integrated circuits are very reliable because they have no moving parts but are based on the movement of charge carriers.

Integrated circuits may include transistors, capacitors, resistors and other semiconductor devices. Typically, such devices are fabricated on a substrate and interconnected to form power supplies, memory arrays, logic structures, timers and other components of an integrated circuit. One type of memory array is a static random access memory (SRAM) in which memory cells are continuously available for reading and writing data.

SRAMs have traditionally been fabricated with CMOS technology. However, more recently, SRAMs have been fabricated with silicon-on-insulator (SOI) technology. An SRAM cell consists of a pair of cross-coupled inverters and a pair of access transistors, pass gates or pass transistors. These pass transistors couple the bit-lines or data-lines to the output of the inverters. The output of the first inverter is connected to the input of the second inverter and the output of the second inverter is connected to the input of the first inverter. Typically an inverter consists of a p-channel pull-up or load transistor and an n-channel pull-down or driver (or drive) transistor. The sources of the load transistors are coupled to the positive terminal of a supply voltage, Vdd. The sources of the driver transistors are coupled to the negative terminal of the supply voltage, Vss.

One prior art SOI SRAM memory cells uses partial trenches to connect to the bodies (silicon under the channel regions) of the driver and pass transistors to the Vss terminal. Use of a partial-trench results in relatively high resistance between the body of a transistor and low resistance active region used to couple to the Vss terminal (Vss contact) because the region that connects the two is very thin. It is thinner than the silicon in the channel region, is buried under field oxide used to isolate transistors, and is located over the back-side (buried) oxide. The partial-trench silicon is also lightly doped, typically with levels equal to or less than the channel doping level. Only the region under the Vss contact with a small overlap to provide for misalignment tolerance uses thicker silicon corresponding to that of the active region and has relatively higher doping level corresponding to that of the source/drain (S/D) implant levels to reduce contact resistance. This region is typically silicided in modern day circuits. Partial trench and partial trench isolation region are interchangeably used below.

In an SOI SRAM cell, in order to keep the SRAM cell size to a minimum, typically only one Vss contact is provided for both pass and driver transistor bodies. In one such prior art cell the Vss contact is placed to the side of the driver transistor on the side farther away from the pass transistor. The distance between the pass transistor body region and the Vss contact is greater than the distance between the driver transistor body region and the Vss contact. The distance between the pass transistor body region and the Vss contact is also greater than the distance between the bodies of the pass transistor and driver transistor. This architecture results in a larger resistance between the pass gate body region to the Vss contact than the resistance between the pass gate body region to the drive transistor body and causes large coupling between pass and drive transistor bodies, which reduces static noise margin for an SRAM cell for partial trench designs.

SUMMARY OF THE INVENTION

In accordance with the present invention, a memory cell with reduced coupling between pass transistor and driver transistor bodies and method are provided that substantially eliminate or reduce disadvantages and problems associated with previously developed systems and methods.

According to one embodiment of the present invention, a semiconductor structure includes an SOI memory cell having a pass transistor having a body and a driver transistor having a body. The SOI memory cell also includes a source voltage contact coupling the bodies of the pass transistor and the driver transistor and a non-square conductive active region coupled to the source voltage contact. The shortest distance between the body of the pass transistor and the source voltage contact is greater than the shortest distance between the body of the pass transistor and the body of the driver transistor, and the shortest distance between the body of the pass transistor and the non-square conductive active region is less than the shortest distance between the bodies of the pass transistor and the driver transistor.

Technical advantages of one or more embodiments of the present invention include providing an improved SOI SRAM memory cell. Accordingly, characteristic variation between multiple memory cells is reduced, stability for the memory cell is increased, and noise margin for the memory cell is improved.

Other technical advantages will be readily apparent to one skilled in the art from the following figures, descriptions and claims.

BRIEF DESCRIPTION OF THE DRAWINGS

For a more complete understanding of the present invention and its advantages is now made to the following description taken in conjunction with the accompanying drawings, wherein like numerals represent like parts, in which.

DETAILED DESCRIPTION OF EXAMPLE EMBODIMENTS OF THE INVENTION

Figure 1:
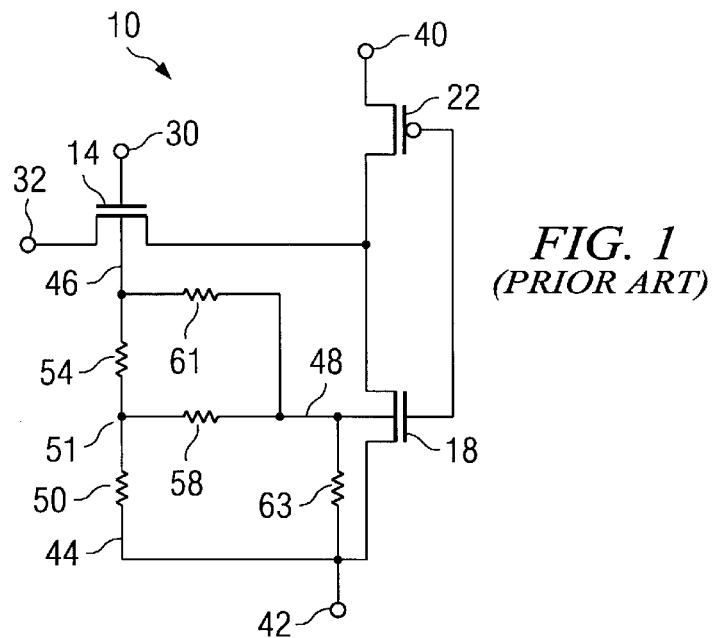
FIG. 1 is a schematic diagram illustrating a prior art memory cell.

Embodiments of the invention may be best understood by referring first to a prior art device. FIG. 1 is a prior art schematic diagram illustrating a circuit 10. Circuit 10 is one half, also called first half, of a silicon-on-insulator (SOI) static random access memory (SRAM) cell, which may be part of a memory array formed on an integrated circuit. The other half the SRAM memory cell, also called second half, is identical to the first half. Although an SRAM memory cell consists of two identical circuits 10, one circuit 10 may also be sometimes referred as a memory cell.

Memory cell 10 comprises a plurality of transistors 14, 18 and 22. According to the illustrated embodiment, transistor 14 comprises an n-channel, pass transistor, transistor 18 comprises an n-channel, drive transistor, and transistor 22 comprises a p-channel, load transistor. Memory cell 10 is operable to store a bit of data and is coupled to a word line through a word line contact 30 and to a bit line through a bit line contact 32. The word line and bit line may be used to select the memory cell 10 for reading the bit of data currently stored in the memory cell 10 or for writing a bit of data to the memory cell 10. Circuit 10 includes resistor elements, which are described in greater detail below.

Figure 2:
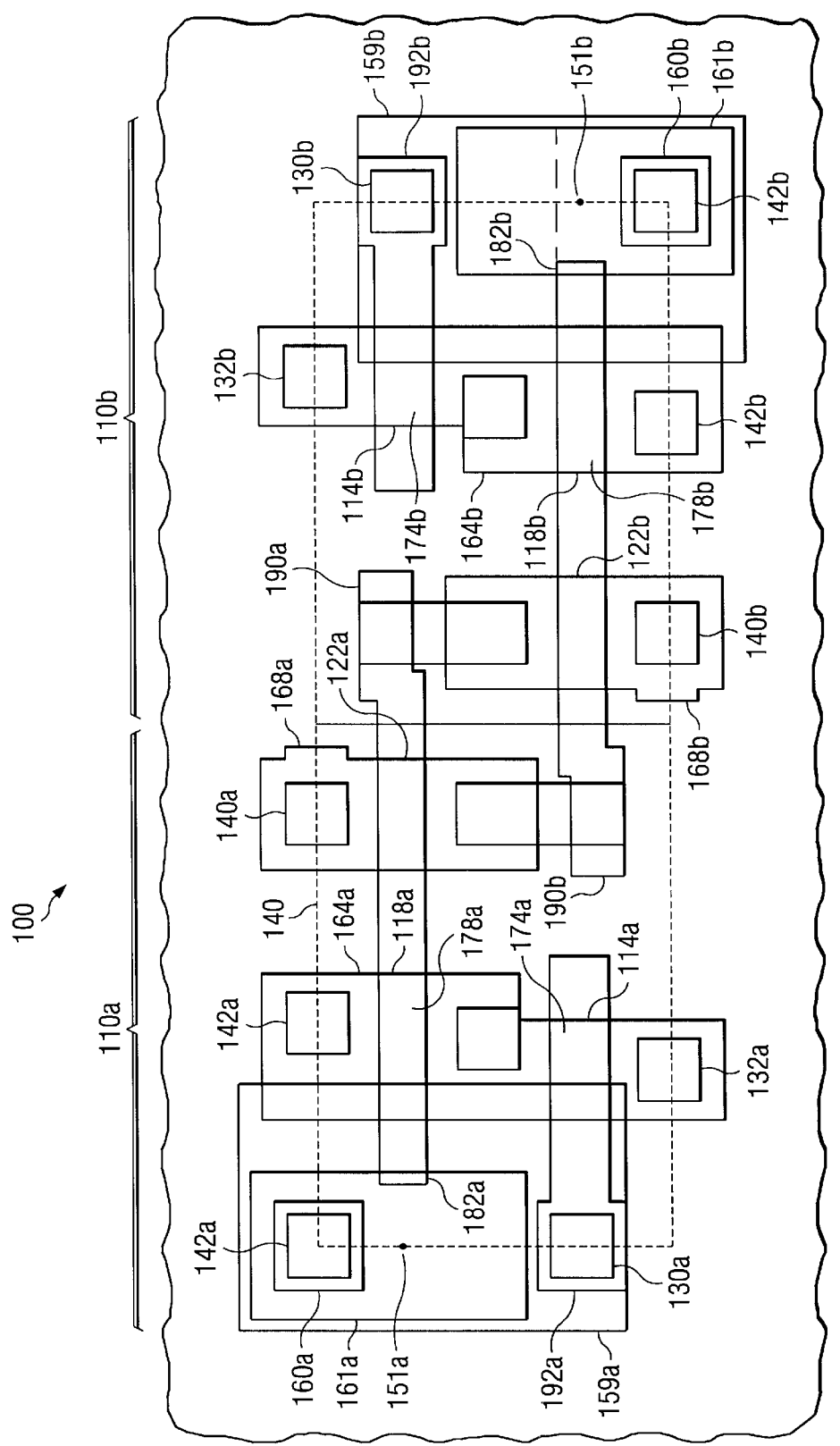
FIG. 2 is a prior art layout for an SOI cell with partial trench isolation process.

FIG. 2 is a top view illustrating a layout for an SRAM SOI semiconductor cell 100 structure comprising a first half of the memory cell 110a and a second half of the memory cell 110b in accordance with one embodiment of the present invention. Elements in the FIG. 2 having the suffix "a" refer to components of memory cell 110a and elements having the suffix "b" refer to components of memory cell 110b. Elements in FIG. 2 without a suffix refer to components shared by both memory cells 110a and 110b. Memory cell 100 comprises a pair of pass transistors 114 (114a and 114b), a pair of driver transistors 118 (118a and 118b), and a pair of load transistors 122 (122a and 122b).

Each memory cell 110a or 110b in structure 100 is operable to store a bit of data and is coupled to a word line through a word line contact 130 (130a and 130b) and to a bit line through a bit line contact 132 (132a and 132b). Shown in the FIG. 2 are active regions 160, 164, and 168, a gate layer 190, a contact layer 142, a tap layer 161 and a partial trench 159. Active, gate and contact layers are described in greater detail below. The cell boundary layer 140 is also shown. Note that the metal and Via layers, which are typically needed to make various connections to form a cell and also to form an array of cells such as bit lines, word lines, Vss lines, Vdd lines etc., are omitted in FIG. 2. Load transistor 122 is coupled to a power supply through contact 140, and the drive transistor 118 is coupled to ground through contact 142.

Each memory cell 110 in the structure 100 also comprises a plurality of active regions 160, 164 and 168. According to one embodiment, active region 160 comprises a p+ active region, active region 164 comprises n-ch active region, and active region 168 comprises a p-ch active region. Gate layer 190 forms the gate for the driver transistor 118 and load transistor 122, and gate layer 192 forms the gate for the pass transistor 114.

The body of an SOI transistor is the channel region under the gate. Body 174 for the pass transistor 114 and a body 178 for the drive transistor 118 are both coupled to ground 142 (also called ground contact) through the active region 160 and partial trench 159. Partial trench 159 is only partially shown in FIG. 2; however, partial trench layer 159 will be formed from the edge of the active region 164 to the edge of the active region 160, which is common to partial trench drawn layer 159. Note that the ground contact 142 is on a side of the driver transistor 118 away from the pass transistor 114. Typically, the p+ active region 160 for the Vss contact is slightly larger than the contact 142 to provide for the misalignment between the contact and the active region. In the layout in FIG. 2, the distance between the body of pass transistor 174 to the body of driver transistor 178 is shorter than the distance between the 15 body of pass transistor 174 to highly doped Vss contact active region 160.

Because partial trench 159 could have relatively high sheet resistance, such as 10 k ohms per square cm, any current that flows from the body of the pass transistor 174 to Vss contact 142 could induce significant voltage at the body of the driver transistor 178 and lower its threshold voltage. A lower threshold voltage can reduce the stability of the cell. In FIG. 2, the x and y coordinates of a point 151 are defined by the x coordinates of the center of the Vss contact 142 and y coordinates of the center of the driver-transistor channel region, respectively. The width of the driver transistor is along the x-direction and length is along the y-direction.

The resistance elements 50, 54, 58, 61 and 63 in FIG. 1 describe the schematic equivalent of the parasitic resistance for the layout in FIG. 2. Resistance element 54 is the resistance between the body of pass transistor 174 to point 151. Node 51 in the FIG. 1 represents point 151 in the layout in the FIG. 2. Resistance element 50 is the resistance between point 151 to Vss contact 142, or to Vss active region 160. The resistance between the edge of the Vss active region 160 to the contact 142 is assumed to be negligible compared to the other resistances in the schematic since this contact region 160 is heavily doped and silicided. Resistance element 58 is the resistance between the body of the driver transistor 178 to the point 151. Resistance element 61 is the resistance between the body of the driver transistor 174 to the body of the driver transistor 178. Resistance element 63 is the resistance between the body of driver transistor 178 to the Vss contact region 142 or to the edge of Vss active region 160.

The distance between the edge of the Vss active region edge 160 and the body of the pass transistor 174 is greater than the distance between the point 151 and the body of the pass transistor 174. This could result in the voltage at the point 151 to rise significantly above the Vss voltage when the pass gate is pulsed. The raised voltage at the point 151 will be coupled to the body of the driver transistor 178 and degrade the stability of the cell.

The coupling of the voltage to the body of the driver transistor when the pass transistor gate is pulsed is also described with respect to FIG. 1. When the pass gate 30 is pulsed, it causes capacitive voltage coupling to its body node 46 through its gate which can only get discharged to the Vss via resistors 54 and 61. Because resistance 61 is less than resistance 54 and resistance values 50, 58 and 63 could also be significant with respect to resistance 61, a significant portion of the voltage at 46 would appear at the node 48 for the driver transistor body.

According to the teachings of the invention, the voltage coupling to the driver transistor body is reduced when the pass gate is pulsed in an SOI cell for a layout similar to that shown in FIG. 2.

Figure 3:
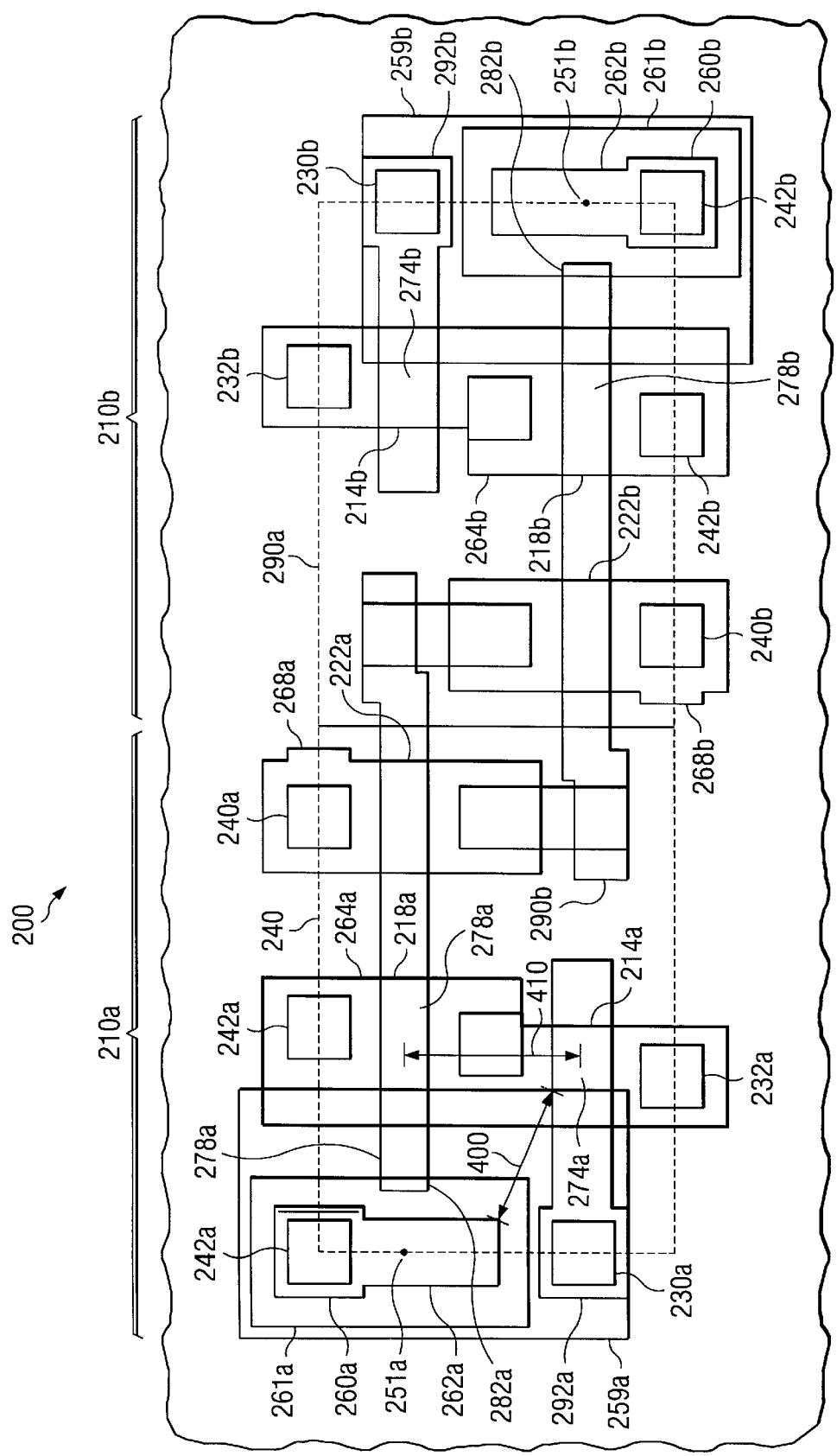
FIG. 3 is a layout for an SOI cell with partial trench isolation process in accordance with one embodiment of the present invention.

FIG. 3 is a top view illustrating a layout for a memory cell 200 in accordance with one embodiment of the present invention. Components of FIG. 3 analogous to those illustrated in FIG. 2 have the same last two digits and are not described again in detail. In FIG. 3 the p+ active region 260 for the Vss contact is extended by adding a p+ active region 262 to active region 160 of the FIG. 2. The new active contact region, which includes the regions 260 and 262 is more like a rectangle rather than square. As used herein, geometry is considered a rectangle if its length and width are different, regardless of whether it has a constant length and width or if it has exactly four right angles. Other geometries may also be used that result is appropriate distances between the components of memory cell 200 as described below, including true rectangles, ovals, and irregularly-shaped geometries. Note that in an array built with cell 200, the cells are mirrored in both x and y directions around the Vss contact 142 center point. In that case the active contact region will have region 260 and two regions 262 on the two sides of region 260 in the y-direction. Typically, the region 162 is symmetrical around the cell boundary 140. Active regions 260 and 262 are designed such that the shortest distance (400 in FIG. 3) between pass transistor 274 to active regions 260 and 262 is less than the shortest distance (410 in FIG. 3) between the pass transistor 274 and driver transistor 278.

Figure 4:
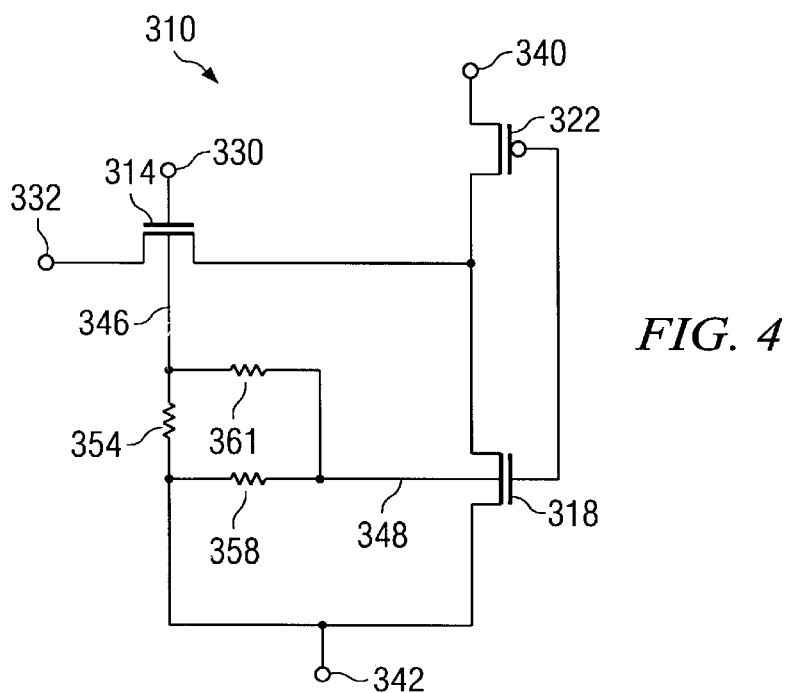
FIG. 4 is a schematic diagram illustrating a memory cell with reduced coupling between pass transistor and drive transistor bodies in accordance with one embodiment of the present invention.

FIG. 4 is the schematic equivalent circuit of the layout in the FIG. 3. This result is similar to the one shown in FIG. 1, with analogous elements having the same last two digits. Note that the resistance 50 has been eliminated and the resistance 63 is merged with the resistance 358. Since the Vss active contact region 262 starts at a point very close to the pass gate body 274, the resistance 354 is much smaller than resistance 54 of FIG. 1. The resistance values 361 and 358 in FIG. 4 are also smaller than resistances 61 and 58 of FIG. 1 because of the presence of the p+ active region 162 in memory cell structure 200 (FIG. 3) compared to those in the FIG. 1. The net impact of adding the p+ active region 262 in the memory cell structure 200 (FIG. 3) is to reduce the coupling to the driver transistor body. This may be achieved without increasing the cell area, as shown in FIG. 3.

In this way, coupling between the bodies for the pass transistor 114 and the drive transistor 118 is minimized, reducing characteristic variation between multiple memory cells 110, increasing stability for the memory cell 110, and improving noise margin for the memory cell 110.

Although the present invention has been described with several embodiments, various changes and modifications may be suggested to one skilled in the art. It is intended that the present invention encompasses such changes and modifications as fall within the scope of the appended claims.

What is claimed is:

1. An SOI memory cell comprising:
   a partial trench region;
   a pass transistor having a body coupled to the partial trench region and a driver transistor having a body coupled to the partial trench region;
   a source voltage contact coupling the bodies of the pass transistor and the driver transistor;
   a rectangular conductive active region coupled to the source voltage contact and the partial trench region;
   wherein the shortest distance between the body of the pass transistor and the source voltage contact is greater than the shortest distance between the body of the pass transistor and the body of the driver transistor; and
   wherein the shortest distance between the pass transistor body and the rectangular conductive active region is less than the shortest distance between the bodies of the pass transistor and the driver transistor.

2. The SOI memory cell of claim 1, and further comprising a conductive contact formed overlying the conductive active region.

3. The SOI memory cell of claim 1, wherein the rectangular conductive active region comprises an oval-shaped active region.

4. The SOI memory cell of claim 1, wherein the rectangular conductive active region comprises an active region having constant length and width.

5. The SOI memory cell of claim 1, wherein the rectangular active region comprises a highly doped p-type semiconductor material.

6. The SOI memory cell of claim 1, wherein the rectangular active region comprises a silicided semiconductor material.

7. The SOI memory cell of claim 1, wherein the rectangular conductive active region comprises an active region having a non-constant width.

8. The SOI memory cell of claim 1, wherein the rectangular active region comprises a highly doped n-type semiconductor material.

9. A semiconductor structure comprising an SOI memory cell, the SOI memory cell having:
   a pass transistor having a body and a driver transistor having a body;
   a source voltage contact coupling the bodies of the pass transistor and the first driver transistor;
   a non-square conductive active region coupled to the source voltage contact;
   wherein the shortest distance between the body of the pass transistor and the source voltage contact is greater than the shortest distance between the body of the pass transistor and the body of the driver transistor; and
   wherein the shortest distance between the body of the pass transistor and the non-square conductive active region is less than the shortest distance between the bodies of the pass transistor and the driver transistor.

10. The semiconductor structure of claim 9, and further comprising a conductive contact formed overlying the conductive active region.

11. The semiconductor structure of claim 9, wherein the non-square conductive active region comprises an oval-shaped active region.

12. The semiconductor structure of claim 9, wherein the non-square conductive active region comprises an active region having constant length and width.

13. The semiconductor structure of claim 9, wherein the rectangular active region comprises a highly doped p-type semiconductor material.

14. The semiconductor structure of claim 9, wherein the rectangular active region comprises a silicided semiconductor material.

15. The semiconductor structure of claim 9, wherein the rectangular conductive active region comprises an active region having a non-constant width.

16. The semiconductor structure of claim 9, wherein the rectangular active region comprises a highly doped n-type semiconductor material.

17. A method for forming an semiconductor structure comprising:
   providing a pass transistor having a body and a driver transistor having a body;
   coupling the bodies of the pass transistor and the driver transistor with a source voltage contact;

coupling a non-square conductive active region to the source voltage contact; and positioning the body of the pass transistor, the source voltage contact, the body of the driver transistor, and the non-square conductive active region with respect to each other such that the shortest distance between the body of the pass transistor and the source voltage contact is greater than the shortest distance between the body of the pass transistor and the body of the driver transistor and the shortest distance between the body of the pass transistor and the non-square conductive active region is less than the shortest distance between the bodies of the pass transistor and the driver transistor.

18. The method of claim 17, and further comprising forming a conductive contact overlying the conductive active region.

19. The method of claim 17, wherein the non-square conductive active region comprises an oval-shaped active region.

20. The method of claim 17, wherein the non-square conductive active region comprises an active region having constant length and width.

21. The method of claim 17, wherein the non-square active region comprises a highly doped p-type semiconductor material.

22. The method of claim 17, wherein the non-square active region comprises a silicided semiconductor material.

23. The method of claim 17, wherein the non-square conductive active region comprises an active region having a non-constant width.

* * * * *